(12) United States Patent
Berens

(10) Patent No.: US 11,984,904 B2
(45) Date of Patent: May 14, 2024

(54) ANALOG-TO-DIGITAL CONVERTER (ADC) HAVING CALIBRATION

(71) Applicant: NXP B.V., Eindhoven (NL)

(72) Inventor: Michael Todd Berens, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/662,009

(22) Filed: May 4, 2022

(65) Prior Publication Data
US 2023/0361780 A1 Nov. 9, 2023

(51) Int. Cl.
*H03M 1/10* (2006.01)

(52) U.S. Cl.
CPC .................................. *H03M 1/1014* (2013.01)

(58) Field of Classification Search
CPC .......... H03M 1/468; H03M 1/12; H03M 1/38; H03M 1/00; H03M 1/124; H03M 1/1245; H03M 1/46; H03M 1/466; H03M 1/804; H03M 1/06; H03M 1/1009; H03M 1/1057; H03M 1/1061; H03M 1/403
USPC .......................... 341/118–120, 155, 161, 172
See application file for complete search history.

(56) References Cited

U.S. PATENT DOCUMENTS

| | | | |
|---|---|---|---|
| 6,891,487 B2 | 5/2005 | Leung et al. | |
| 7,038,609 B1 * | 5/2006 | Hurrell | H03M 1/145 |
| | | | 341/172 |
| 7,605,741 B2 * | 10/2009 | Hurrell | H03M 1/1047 |
| | | | 341/118 |
| 7,868,796 B2 | 1/2011 | Berens et al. | |
| 8,451,151 B2 | 5/2013 | Lin | |
| 9,197,231 B1 | 11/2015 | Feddeler et al. | |
| 9,319,059 B1 * | 4/2016 | Sharma | H03M 1/403 |
| 9,362,937 B1 | 6/2016 | Burgio et al. | |

(Continued)

FOREIGN PATENT DOCUMENTS

CN 113839673 A 12/2021

OTHER PUBLICATIONS

Chen et al., "Split capacitor DAC mismatch calibration in successive approximation ADC," 2009 IEEE Custom Integrated Circuits Conference, Sep. 13-16, 2009, DOI: 10.1109/CICC.2009.5280859, San Jose, CA, USA, pp. 279-282.

(Continued)

*Primary Examiner* — Linh V Nguyen

(57) ABSTRACT

An analog-to-digital converter (ADC) includes a digital-to-analog converter (DAC) and a comparator having a first input coupled to receive an output voltage of the DAC, a second input, and a comparison output. The ADC also includes successive-approximation-register (SAR) circuitry having an input to receive the comparison output, and an output to provide an uncalibrated digital value. The DAC includes a Most Significant Bits (MSBs) sub-DAC including a set of MSB DAC elements and a Least Significant Bits (LSBs) sub-DAC including a set of LSB DAC elements. The ADC also includes calibration circuitry which receives the (Continued)

uncalibrated digital value and applies one or more calibration values to the uncalibrated digital value to obtain a calibrated digital value. The calibration circuitry obtains a calibration value for each MSB DAC element using the set of LSB DAC elements, the termination element, and at least one of the one or more redundant DAC elements.

20 Claims, 4 Drawing Sheets

(56) References Cited

U.S. PATENT DOCUMENTS

| | | | |
|---|---|---|---|
| 9,432,044 B1 | 8/2016 | Lee et al. | |
| 9,559,716 B1* | 1/2017 | Matsui | H03M 1/1061 |
| 9,843,340 B2* | 12/2017 | Funato | H03M 1/466 |
| 10,243,577 B1 | 3/2019 | Berens et al. | |
| 10,903,847 B2* | 1/2021 | Matsui | H03M 1/145 |
| 11,424,757 B2* | 8/2022 | Chung | H03M 1/468 |
| 2010/0079325 A1 | 4/2010 | Berens et al. | |
| 2010/0214140 A1 | 8/2010 | Reinhold et al. | |
| 2011/0109488 A1* | 5/2011 | Nakajima | H03M 1/1004 |
| | | | 341/120 |
| 2013/0044015 A1* | 2/2013 | Reinhold | H03M 1/1061 |
| | | | 341/110 |
| 2014/0285370 A1* | 9/2014 | Miki | H03M 1/08 |
| | | | 341/172 |
| 2017/0012637 A1* | 1/2017 | Venca | H03M 1/462 |
| 2022/0077867 A1* | 3/2022 | An | H03M 1/1061 |

OTHER PUBLICATIONS

Li, et al., "Calibration for split capacitor DAC in SAR ADC," 2013 IEEE 10th International Conference on ASIC, Oct. 28-31, 2013, DOI: 10.1109/ASICON.2013.6811966, Shenzhen, China, pp. 1-4.

Shen, et al., "A 16-bit 16-MS/s SAR ADC With On-Chip Calibration in 55-nm CMOS," Analog Devices, IEEE Article, Visit analog.com, pp. 1-11.

Um et al., "A Digital-Domain Calibration of Split-Capacitor DAC for a Differential SAR ADC Without Additional Analog Circuits," IEEE Transactions on Circuits and Systems I: Regular Papers ( vol. 60, Issue: 11, Nov. 2013), DOI: 10.1109/TCSI.2013.2252475, pp. 2845-2856.

Um et al., "Digital-domain calibration of split-capacitor DAC with no extra calibration DAC for a differential-type SAR ADC," IEEE Asian Solid-State Circuits Conference 2011, Nov. 14-16, 2011, DOI: 10.1109/ASSCC.2011.6123608, Jeju, Korea (South), pp. 77-80.

Dai Peng et al.: "A self-calibration method for capacitance mismatch in SAR ADC with split-capacitor DAC", Microelectronics Journal, vol. 46, No. 6, Apr. 10, 2015 (Apr. 10, 2015), pp. 431-438, XP029228619, ISSN: 0026-2692, DOI: 10.1016/J.MEJO.2015.03.011.

* cited by examiner

US 11,984,904 B2

ANALOG-TO-DIGITAL CONVERTER (ADC) HAVING CALIBRATION

BACKGROUND

Field

This disclosure relates generally to data conversion circuits, and more specifically, to Analog-to-Digital Converters (ADC) having calibration.

Related Art

An ADC converts an analog input to a digital output. One type of ADC circuit is a Successive Approximation Register (SAR) ADC. However, due to such factors as device mismatch, mismatch of the scaling elements, parasitic elements, and noise, accuracy of a high resolution SAR ADC is compromised. In order to obtain accuracy at higher resolutions, a calibration method is desired to improve differential and integral non-linearity of the ADC.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The resolution of SAR ADCs is usually limited by the matching of elements in the ADC's digital-to-analog conversion (DAC) sub-block. In such type of SAR ADCs, a split-capacitor DAC may be used to reduce the number of matching elements required. Also, split-capacitor DACs significantly decrease the area requirement and increase speed of the ADC. However, this type of split-capacitor DAC uses one or more scaling capacitors which are non-unit sized. These scaling capacitors reduce device matching and introduce unwanted parasitics.

SAR ADCs are also susceptive to noise, settling, and other speed and environmentally induced errors, which negatively impact accuracy of a SAR ADC. Therefore, a technique for eliminating such errors is the use of redundancy. In a SAR ADC, elements are added sequentially to adjust an input-dependent voltage. The voltage is compared to a reference voltage at each addition and the DAC elements are adjusted based on the comparison results. Upon completion, the comparison results are a digital representation of the analog input voltage. With the use of redundancy, an offset is included in the comparison at one or more predetermined points and an extra comparison is performed. These intentional offsets combined with the extra comparisons create the redundancy which relaxes the requirements on both the DAC settling time and the comparator accuracy during the portion of the approximation which uses redundancy.

Furthermore, in order to achieve better than 11-12 bits of accuracy for the DAC, some form of calibration is typically required. In one aspect of the present invention, a self-calibration method using redundancy is used to improve differential and integral non-linearity of a SAR ADC with a split-capacitor DAC which corrects for mismatch and parasitics on the most significant bits (MSBs) and scaling elements. For example, the capacitor calibrations described herein may use the SAR ADC's redundancy to perform calibration without the need to add or re-size any of the SAR ADC components. The size of any scaling capacitors can therefore be kept closer to ideal as compared to without the use of such calibration, thus improving linearity and reducing gain errors.

Figure 1:
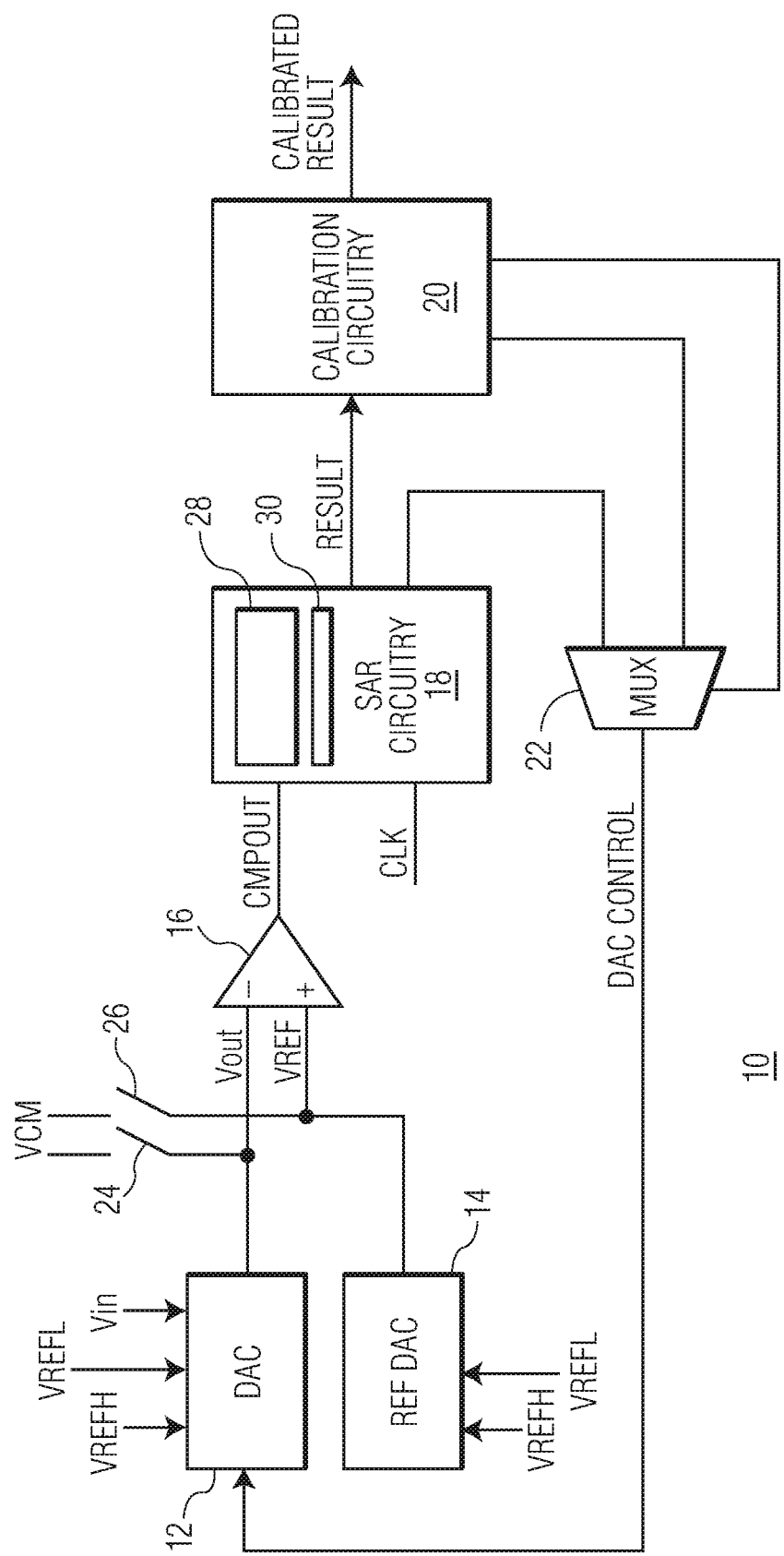
FIG. 1 illustrates, in block diagram form, a SAR ADC in accordance with one embodiment of the present invention.

FIG. 1 illustrates a SAR ADC 10 in accordance with one embodiment of the present invention. SAR ADC 10 includes a DAC 12, reference DAC (REF DAC) 14, a comparator 16, SAR circuitry 18, calibration circuitry 20, and a multiplexor (MUX) 22. DAC 12 is coupled to supply voltage terminals Vrefh, Vrefl, and Vin, and provides an output voltage (Vout) to an inverting input, V−, of comparator 16. REF DAC 14 is also coupled to Vrefh and Vrefl and provides a reference voltage, Vref, to a non-inverting input, V+, of comparator 16. The inverting input of comparator 16 is also coupled to a common mode voltage, VCM, via a switch 24, and the non-inverting input of comparator 16 is coupled to VCM via a switch 26. An output of comparator 16, CMPOUT, is provided to SAR circuitry 18, which includes storage circuitry 28 to store a SAR result, and this uncalibrated result, RESULT, is provided to calibration circuitry 20. Calibration circuitry 20 calibrates the result and provides a CALIBRATED RESULT for use by other circuitry. SAR circuitry 28 and calibration circuitry 20 each provides a set of control signals to MUX 22, which, depending on whether a data conversion or calibration is occurring, outputs these control signals as DAC control signals to DAC 12. Calibration circuitry 20 provides a select signal to MUX 22 which selects between the output of the SAR circuitry 18 and calibration circuitry 20.

In operation, REF DAC 14 provides a reference voltage, VREF. However, in alternate embodiments, VREF may be provided by other sources. In the illustrated embodiment, DAC 12 uses a charge redistribution array for data conversion from digital to analog. In one embodiment, the charge redistribution array is implemented using binary weighted capacitive elements (e.g. capacitors). During a sample phase of a conversion (in which DAC 12 operates normally to convert a digital value to an analog value), switches 24 and 26 are placed in conductive mode to short the inputs of comparator 16 to a common mode voltage, VCM, while an input voltage Vin is sampled onto DAC 12. Then, during a comparison phase of the conversion (also referred to as an approximation phase), switches 24 and 26 are placed in non-conducting mode and the DAC capacitors are controlled to successively approximate the input voltage Vin using the output of comparator 16 to make decisions on how to switch the capacitors of DAC 12. At each step of the approximation, the output of comparator 16 results in a bit being stored in storage circuitry 28. The resulting digital word, output as RESULT, is the uncalibrated digital representation of the analog input Vin. In one embodiment, in which one or more redundant bit(s) are also used, the one or more redundant bit(s) are also provided by comparator 16, as will be described below, and can be stored within storage circuitry 30 of SAR circuitry 18. Note that the resulting digital word, RESULT, is selectively adjusted based on the one or more redundant bits(s) prior to being output by SAR circuitry 18.

While DAC 12 implements the charge redistributed array using capacitors, alternate embodiments may use any type of charge redistribution array for data conversion in addition to or instead of capacitors, such as, for example, resistive elements or a combination of capacitive and resistive elements.

Figure 2:
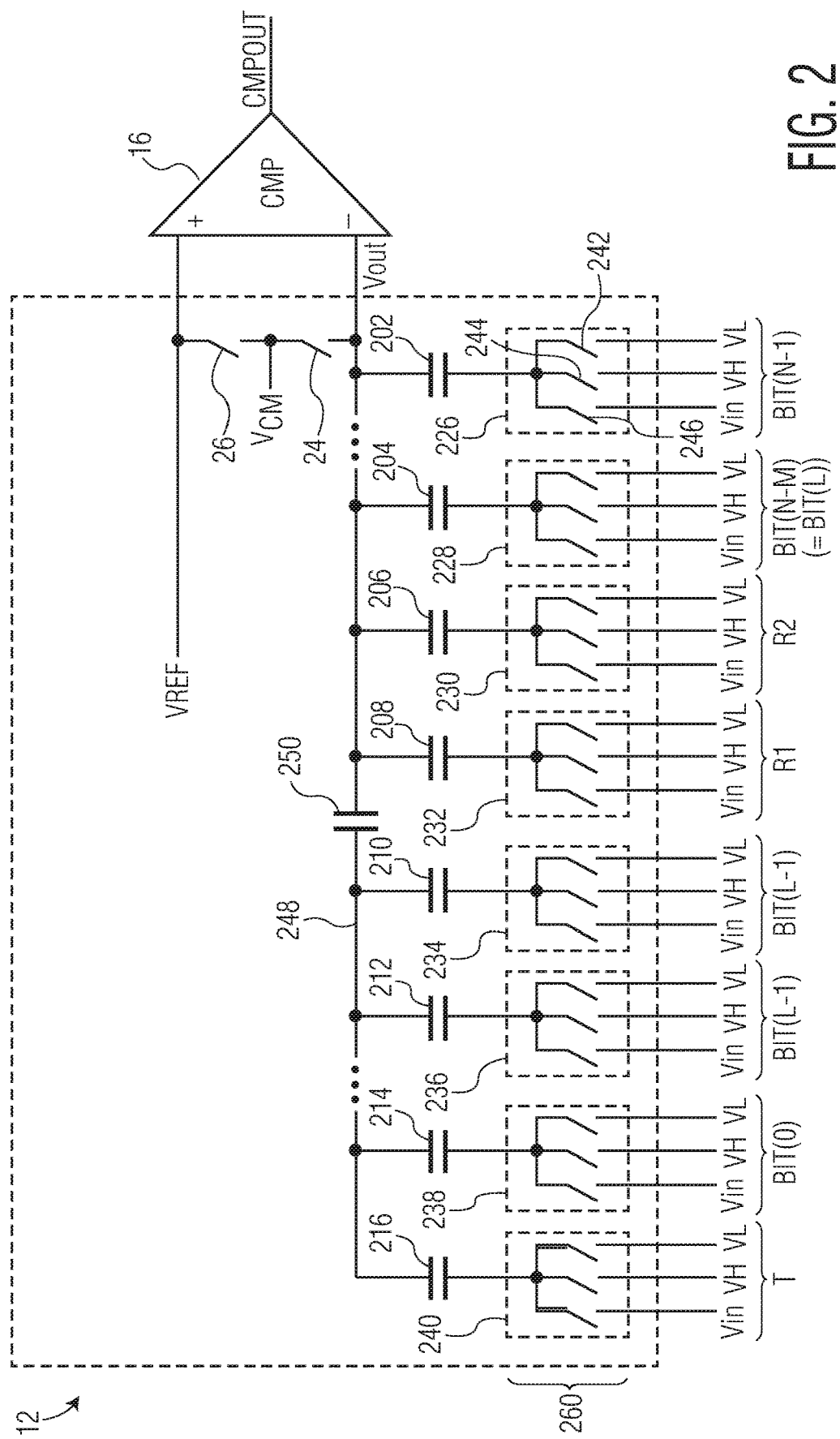
FIG. 2 illustrates, in partial block diagram and partial schematic form, a DAC of the SAR ADC of FIG. 1 in accordance with one embodiment of the present invention.

FIG. 2 illustrates, in partial schematic and partial block diagram form, DAC 12 in further detail, in accordance with one embodiment of the present invention. In the illustrated embodiment, DAC 12 is an N-bit split capacitor DAC which is split into two sub-DACs, with the sub-DACs coupled to each other via a scaling capacitor, Csc 250. DAC 12 includes N bits represented by N binary weighted capacitors. The N bits of DAC 12, Bit(0)-Bit(N−1), includes L least significant bits (LSBs) and M MSBs (in which (i.e. N=L+M). The L LSBs, Bit(0)-Bit(L−1), are represented on one side of Csc 250, and the M MSBs, Bit(N−M)-Bit(N−1), are represented on the other side of Csc 250, in which Bit(N−M)=Bit(L) in the illustrated example. Note that the L LSBs can be referred to as Bits[(L−1):0] and the M MSBs as Bits[(N−1):(N−M)] or Bits[(N−1):L]. DAC 12 also includes two redundant bits (also referred to as redundant DAC elements or redundant elements), R1 and R2, which are also represented by capacitors. Although, as described with the illustrated embodiment, each of the LSBs and the MSBs are represented by binary weighted capacitors (i.e. binary encoded capacitors), alternate embodiments may use different encodings. For example, in an alternate embodiment, the LSBs are represented by L binary encoded capacitors, while the M MSBs are represented by unary/thermometer encoded bits or a combination of one or more binary encoded bits and one or more unary/thermometer encoded bits. Also, depending on the encodings used for the DAC capacitors, each of the N bits can be represented by one or more capacitors.

In the illustrated embodiment of DAC 12, the DAC elements are capacitors, including capacitors 202-216 coupled in parallel to one another. Capacitor 216 is a termination capacitor having a unit capacitance of C. Capacitors 214, . . . 212, and 210 correspond to the L LSBs Bit(0)-Bit(L−1), and each has a binary weighted capacitance starting with capacitor 214 having a capacitance of C, to capacitor 212 which has a capacitance of $(2^{L-2})*C$, to capacitor 214 which has a capacitance of $(2^{L-1})*C$. The capacitors corresponding to these LSBs may be referred to as the LSBs sub-DAC of DAC 12. Capacitors 204, . . . , 202 correspond to the M MSBs Bit(N−M)-Bit(N−1), and each has a binary weighed capacitance starting with capacitor 204 having a capacitance of C to capacitor 202 which has a capacitance of $(2^{M-1})*C$. The capacitors corresponding to these MSBs may be referred to as the MSBs sub-DAC. Capacitors 208 and 206 correspond to redundant bits R1 and R2, which can be used to set an offset for DAC elements 202-204, and can be used to provide redundancy for Bit(N−M). In one embodiment, each of R1 and R2 has one half the capacitance of Bit(N−M) (i.e. have a capacitance such that the capacitance of R1=the capacitance of R2=½* (capacitance of capacitor 204)). In this example, R1 and R2 together may form a redundant bit to Bit(N−M), referred to as Bit(N−M)', as will be described further below. In an alternate embodiment, note that R1 and R2 can be located on the opposite side of Csc 250 than as illustrated in FIG. 2. In another alternate embodiment, additional groups of one or more redundant bits may be added within the MSBs sub-DAC, the LSBs sub-DAC, or both the MSBs and LSBs sub-DACs.

In alternate embodiments, the MSBs sub-DAC may use unary/thermometer encoding or a combination of binary and unary/thermometer encoding, or other encodings or combinations of encodings. Also, in alternate embodiments, DAC 12 may include any number of LSBs sub-DACs, each coupled with a corresponding scaling capacitor. For example, the LSBs sub-DAC of FIG. 2 may divided into two LSBs sub-DACs coupled with another scaling capacitor. In this case, DAC 12 would include 3 sub-DACs rather than 2 sub-DACs as illustrated. In other embodiments, the LSBs sub-DACs may also use unary/thermometer encoding or a combination of binary and unary/thermometer encoding, or other encodings or combinations of encodings. In one embodiment, each scaling capacitor is used to reduce the number of DAC elements (e.g. capacitors) required to represent the input. For example, capacitor 250 scales the voltage for capacitors 210-216 by a first factor of $2^{(N-M)}$.

Capacitors 216, 214, . . . , 212, and 210 each has a first terminal (i.e. top plate) coupled to a circuit node 248 at a first terminal of Csc 250, and capacitors 208, 206, 204, . . . , 202 each has a first terminal (i.e. top plate) coupled to Vout. A second terminal (i.e. bottom plate) of each capacitor is coupled to a respective switch array 226-240 to control the voltage applied at the bottom plate of capacitors 202-216. Each switch array may be included as part of DAC control circuitry 260 which applies Vin, Vrefh, and Vrefl, as needed, based on the current operation, e.g. sample or comparison phases of a conversion or calibration operation. Each switch array 226-240 includes three switches 242-246 (as labeled for switch array 226). Switch 242 is coupled to Vrefl (written as VL in FIG. 2), switch 244 is coupled to Vrefh (written as VH in FIG. 2), and switch 246 is coupled to input voltage Vin. During the sample phase, switch 246 is set to conductive mode to apply Vin to the bottom plates of capacitors 202-204 and 210-216 and switches 242-244 are in nonconductive mode. During the approximation phase, switch 246 is non-conductive, and either switch 242 or 244 will be in conductive mode depending on whether the particular bit is required to represent the input voltage. The switch settings to apply a selected voltage to the corresponding bottom plate can be provided to the switch arrays of DAC control circuitry 260 by way of DAC CONTROL via MUX 22 of FIG. 1.

Figure 4:
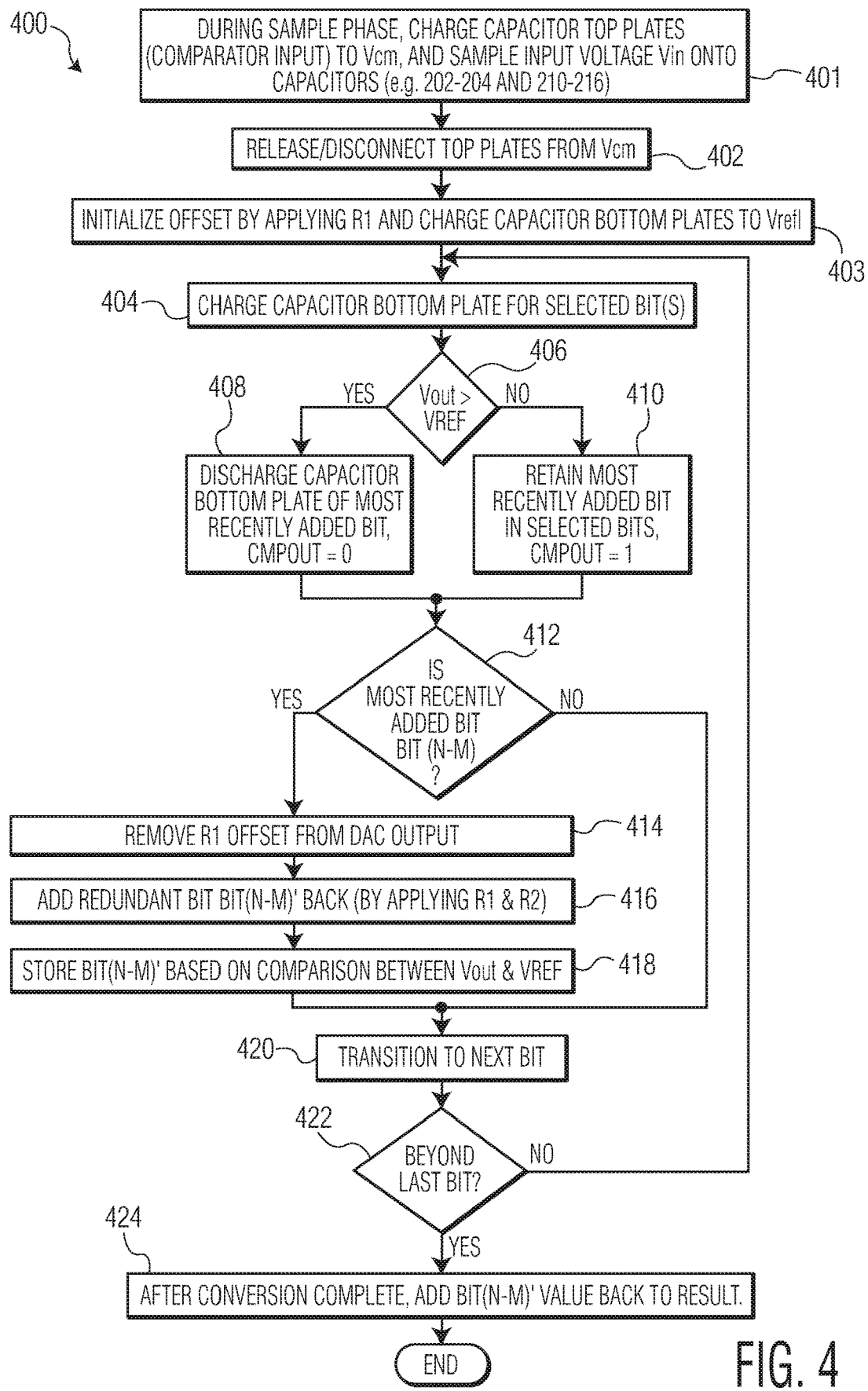
FIG. 4 illustrates, in flow diagram form, a method of using redundancy within the DAC of FIG. 2 to perform successive approximation within the SAR ADC of FIG. 1, in accordance with one embodiment of the present invention.

Operation of DAC 12 with respect to a normal conversion operation will be briefly discussed in reference to FIG. 4. In summary, Vin is first sampled during a sample phase. During the sample phase, each of Vout and VREF are precharged to VCM, and Vin is sampled by setting the bottom plates of the capacitors to Vin. Note that Vrefh is greater than Vrefl, and setting the bottom plate of a capacitor to Vrefh may be referred to as turning on or adding a capacitor and setting the bottom plate to Vrefl may be referred to as turning off or removing the capacitor.

Following the sample phase, a comparison phase is initiated in which each result bit value is determined, in turn, by comparator 16 and SAR circuitry 18 of FIG. 1. Note that the comparison phase may also be referred to as the approximation phase. For example, the comparison (or approximation) phase begins with setting the bottom plate of the largest MSB capacitor to Vrefh. The appropriate control signals to do so may be provided as part of DAC CONTROL via MUX 22 from SAR circuitry 18. If this pushes Vout greater than VREF, cmpout=0, which is stored in storage circuity 28. In this case, the bottom plate of that capacitor is returned to Vrefl. The appropriate control signals to do so may be provided as part of DAC CONTROL via MUX 22 from SAR circuitry 18. If this does not push Vout greater than VREF, cmpout=1, which is stored in storage circuitry 28. In this case, the bottom plate of that capacitor is maintained at Vrefh. The next MSB capacitors (MSB-1, MSB-2, etc.) and the LSB capacitors are then each processed in a similar fashion to determine all N digital output bits of RESULT. Additionally, one or more redundant bits may be determined and stored in storage circuitry 30.

Referring to FIGS. 2 and 4, FIG. 4 illustrates, in flow diagram form, a method 400 for adding offset to comparison bits at predetermined points in the DAC 12 of FIG. 2. Method 400 begins with process 401 in which, during the sample phase, the capacitor top plates (and the inputs of comparator 16) are charged via switches 24 and 26 to Vcm. Also during the sample phase, the input voltage Vin is sampled on the DAC capacitors (e.g. applied to the bottom plates of capacitors 202-204 and 210-216). Note that Vin is not sampled on R1 and R2 (instead, Vrefl is applied to their bottom plates during the sample phase). Next, in process 402, at the end of the sample phase, the capacitor top plates are released from Vcm by opening switches 24 and 26. Process 403 therefore begins the SAR/approximation phase, in which the remaining blocks of method 400 are performed during the SAR/approximation phase.

In the illustrated embodiment of FIG. 2, the offset is provided by R1, in which corresponding capacitor 208 has half the capacitance of capacitor 204 for Bit(N−M). Process 403 includes initializing the offset by applying R1 (switching its bottom plate from Vrefl to Vrefh) and charging the bottom plates of capacitors 202-204 and 210-216 to Vrefl for the approximation phase. Note that the offset is one-half the value of the lowest bit weight in the group of capacitors 202-204. If DAC 12 is a 12-bit DAC with little endian architecture, and capacitor 204 corresponds to Bit 8 (L=N−M=12−4=8) with capacitor 202 corresponding to Bit 11 (N−1=12−1=11), the weight of capacitor 204 would be 256 ($2^8$) and capacitor 208 could be used to provide an offset value of 128 while capacitors 202-204 (i.e. Bits[(N−1):(M−N)]) are being converted. Other suitable offset values can be used. At this point, R2 is unused and therefore off (its bottom plate remains connected to Vrefl).

Process 404 includes charging the bottom plate(s) of capacitors for selected bits to Vrefh. During the approximation phase, capacitors are added in bit by bit, starting from the MSB of the group. For example, capacitor 202 for Bit(N−1) is initially selected, followed by the capacitor for Bit(N−2) (i.e. the next MSB), and so on. Capacitor 208 can be used to provide an offset while Bits[(N−1):(N−M)] are being sequentially selected for successive approximation.

Process 406 includes using comparator 18 to determine whether the resulting output, Vout, with the selected bits is greater than the VREF. If so, process 408 includes discharging the bottom plate of the capacitor corresponding to the bit most recently added to or included in the approximation, in which discharging the bottom plate includes applying Vrefl to the bottom plate. The value cmpout=0 is stored as part of RESULT in storage circuitry 28. If Vout is less than or equal to VREF, process 410 retains the most recently added bit in the approximation, in which the bottom plate of the corresponding capacitor is not discharged (remains at Vrefh). The value cmpout=1 is therefore stored as part of RESULT in storage circuitry 28.

After performing process 408 or 410, process 412 determines whether the most recently added bit (whether retained in the approximation or not) corresponded to Bit(N−M). In the illustrated embodiment, capacitor 208 (corresponding to R1) is used as an offset for the group of MSBs including Bits[11:8], and Bit(N−M) is the last added bit of that group. Therefore, if the most recently added bit is not Bit(N−M), i.e. is not the final bit being approximated with the R1 offset, prior to a redundant bit, then process 412 transitions directly to process 420.

However, if the most recently added bit is Bit(N−M), process 412 transitions to process 414 to remove the offset from the DAC output, Vout. This may include turning off capacitor 208 of R1. After process 414, process 416 adds a redundant bit, Bit(N−M)', to the DAC output. This may include adding (turning on) capacitor 208 of R1 as well as capacitor 206 of R2. That is, as described above, the combination of R1 and R2 may represent the redundant bit Bit(N−M)' in which capacitance of Bit(N−M)'=capacitance of Bit(N−M). Therefore, in the illustrated embodiment which includes both R1 and R2, each being half of Bit(N−M), processes 414 and 416, together, can be achieved by simply keeping capacitor 208 of R1 turned on, and additionally turning on capacitor 206 of R2. Alternatively, R1 can be removed in process 414, and R2 added in process 416 in which R2 alone is the redundant bit which has the same capacitance as Bit(N−M). In this alternate embodiment, R2=Bit(N−M) such that capacitance of R1=½* (capacitance of R2)=½* (capacitance Bit(N−M)).

After processes 414 and 416, process 416 stores the redundant bit, Bit(N−M)' in storage circuitry 30, based on a comparison between Vout and VREF. If Vout is greater than VREF, then Bit(N−M)' is 0, otherwise it is 1. The value of Bit(N−M)' can be stored in storage circuitry 30.

After process 418 (or after the "no" branch from process 412), process 420 transitions to the next MSB, if any, in order (from Bit[11] sequentially down to Bit[0]). After process 420, process 422 determines whether the last bit in the N-bit DAC word, RESULT, has been previously selected, that is, if the next bit is beyond the number of bits included in the DAC word. If not, process 422 transitions back to process 404 for the next selected bit. If so, then in process 424, conversion is complete (resulting in the N-bit DAC word, RESULT, in storage circuitry 28). However, this N-bit word does not include the redundant bit which was additionally used, therefore, the value of the redundant bit needs to be added. In the illustrated example, Bit(N−M)' is in the bit[8] position, with an equivalent weight of 256 ($2^8$), therefore, if Bit(N−M)'=1, then 256 is added to the decimal value of the N-bit DAC word in storage circuitry 28, in which the adjusted value is provided as RESULT. If Bit(N−M)'=0, no adjustment is made. Process 424 ends method 400 and completes the data conversion, providing the selectively adjusted RESULT at the output of SAR circuitry 18. As will be described below, RESULT is provided as an input to calibration circuitry 20 which produces a calibrated result.

Note that the illustrated embodiment of FIG. 2 includes a redundant bit after B(N−M) for Bits[(N−1):(N−M)], and no other offsets or redundant bits. However, in alternate embodiments, additional bits may be used for redundancy during successive approximation of other groups of bits with lower significant values. For example, an equivalent bit to Bit 4 may be used to supply an offset during the successive approximation on Bits 5-7, and then an equivalent bit to Bit 5 may be used as a redundant bit. The value of the next offset can be set to a value that is one-half the value of the lowest bit weight in the group of Bits 5-7. For a 12-bit DAC, the weight of Bit 5 would be 32 and the value of the offset would be 16. Other suitable values can be used for the offset, however. Additional processing in processes 416, 418, and 424 may be needed to take into consideration the additional offsets/redundant bits. Therefore, while storage circuitry 28 stores the resulting N-bit DAC word, storage circuitry 30 can store any number of redundant bits used to adjust the resulting N-bit result. Also, as discussed above, in an alternate embodiment of FIG. 4, R1 is used for the offset and then R1+R2 as the redundant bit (without switching R1 back and simply adding R2 instead). This alternate embodiment consumes less power (due to less switching).

The selectively adjusted RESULT stored in storage circuitry 28 is provided by SAR circuitry 18 as RESULT to calibration circuitry 20 which provides the CALIBRATED RESULT. Based on the conversion results for bits(N−1:L), a particular calibration value is added or subtracted from the result to provide the calibrated result. These calibration values, in one embodiment, can be determined beforehand and stored within calibration circuitry 20 for use with each conversion. A calibration value, res((N−M):(N−1)), can be determined and stored for each MSB bit Bit(N−M) to Bit(N−1). Alternatively, there can be more calibration values than bits, depending on the type of encoding used for the ADC's DAC. In one embodiment, a calibration value res(L) is obtained by comparing each MSB against the sum of all capacitors from Bit(0) to Bit(L−1), plus the termination capacitor, T. The Bit(0) to Bit(L−1) plus T combination is considered a "unit" for measurement, and the difference from that "unit" is measured for each MSB. These calibration values, res(N−M) through res(N−1), can then be stored and applied to the conversion result, RESULT, to obtain the CALIBRATED RESULT.

Figure 3:
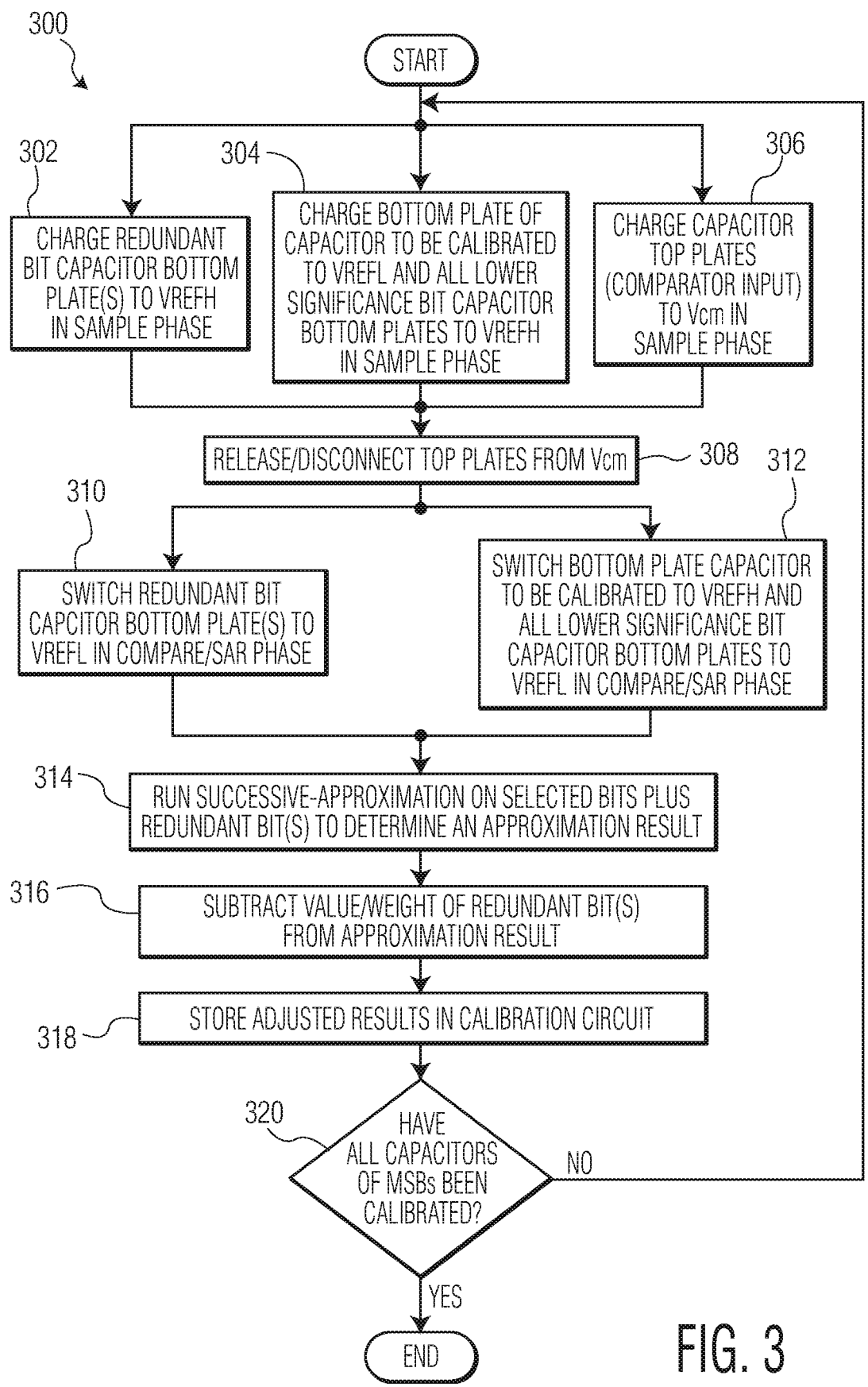
FIG. 3 illustrates, in flow diagram form, a method of using redundancy to determine calibration values for bits of the DAC of FIG. 2, in accordance with one embodiment of the present invention.

FIG. 3 illustrates a method 300 for obtaining the calibration values corresponding to MSBs Bits[(N−1):(M−N)]. For each calibration, control values can be sent as DAC control to DAC 12 via MUX 22 from calibration circuitry 20 in order to couple the capacitors appropriately to Vrefh or Vrefl. During calibration, calibration circuitry 20 may send a control signal to MUX 22 such that the input from calibration circuitry 20 is selected as providing DAC control to DAC 12. As will be described in more detail with respect to method 300, obtaining a calibration value for each MSB capacitor includes individually comparing a capacitance of the selected MSB capacitor to a sum of all capacitances of all lower significance bit capacitors of the MSBs sub-DAC, all capacitors of the LSBs sub-DAC, the termination capacitor, and the one or more redundant capacitors. For each comparison result (provided by comparator 16), a successive approximation is performed by SAR circuitry 18 to obtain an approximation for the selected MSB capacitor, in which this approximation represents the capacitor mismatch plus the value of any redundant bits used during calibration. Therefore, to obtain the calibration value for the selected MSB capacitor, the approximation is adjusted with the value of the redundant bits.

Referring to FIGS. 2 and 3, method 300 determines res(N−M) to res(N−1) which correspond to Bit(N−M) to Bit(N−1), respectively. Note that since L=N−M for the illustrated embodiment, res(N−M) and Bit(N−M) will be referred to as res(L) and Bit(L), respectively, to improve readability of the equations below. In method 300, each capacitor of the MSBs is selected and processed in turn. In one embodiment, each MSB is selected in order, from Bit(N−1) to Bit(L). Method 300 begins with processes 302, 304, and 306 of the sample phase. Process 302 charges the bottom plate(s) of the redundant bit(s) to Vrefh in the sample phase. In one embodiment, for the calibration, bit R1 is used. Alternatively, both R1 and R2 can be used. The redundant bit(s) are used in calibration to create an offset in order to force the approximation result to be a positive value. In this sense, the size of redundant bits used to create the offset should exceed the largest possible mismatch among calibrated capacitors. Process 304 charges the bottom plate of the current capacitor being calibrated to Vrefl and the bottom plates of all lower significant bit capacitors, including the termination capacitor, to Vrefh in the sample phase. For example, the first time through method 300, Bit(N−1) is first selected and processed, such that Bit(N−1) is the current capacitor being calibrated. In this example, the bottom plate of Bit(N−1) is charged to Vrefl, while the bottom plates of R1, T, and each of Bit(0) to Bit(L−1) are all charged to Vrefh in the sample phase. Process 306 charges the top plates of the capacitors (at the inputs of comparator 16) via switches 24 and 26 to Vcm in the sample phase. Processes 302, 304, and 306 can be performed simultaneously in the sample phase.

After processes 302, 304, and 306 are performed, method 300 transitions to process 308 in which the comparator inputs are released (switches 24 and 26 are opened, disconnecting the top plates of the capacitors from Vcm). Method 300 continues with the approximation phase (also referred to as the SAR approximation phase or comparison phase) which begins with processes 310 and 312, which can be performed simultaneously. Process 310 switches the bottom plate of the redundant bit(s) to Vrefl for the approximation phase, generating an offset. Process 312 switches the bottom plate of the current capacitor being calibrated to Vrefh, and the bottom plates of all the lower significance capacitors (including the termination capacitor) to Vrefl for the approximation phase. In the current example of calibration Bit(N−1), the bottom plate of Bit(N−1) is switched from Vrefl to Vrefh, while the bottom plates of R1, T, and each of Bit(0) to Bit(L−1) are all switched from Vrefh to Vrefl in the approximation phase. Note that the transition of the bottom plate of R1 from Vrefh to Vrefl guarantees that V− at the input of comparator 16 is below VREF prior to performing the successive approximation. This allows for a normal approximation rather than needing calibration-specific approximately logic.

Continuing with the approximation phase, in process 314, the successive-approximation is run on selected bits, optionally including the redundant bit(s), so as to approximate the capacitor mismatch, which is provided as the difference between Bit(L) and the sum of R1, Bit(L−1) to Bit(0), and the termination capacitor, T. Note that the successive-approximation need not be run on all bits because this difference is a small value, and only a subset of the bits may provide sufficient accuracy. Since the result of the approximation (in storage circuitry 28) is the capacitor mismatch plus the R1 value, processor 314 transitions to process 316 in which the value (i.e. weight) of the redundant bit(s) are subtracted from the result of the approximation in storage circuitry 28, thus adjusting RESULT (similar to what was described above in reference to process 424). For example, for the case of R1 in the example provided above for method 400, the weight or value of R1 is ½ Bit(L) which is 128 (assuming a 12-bit DAC with Bit(L) being weighted as 256 and Bit(N−1) as 2048). Therefore, the decimal value of 128 is subtracted from the decimal value of the approximation result. Afterwards, in process 318, the adjusted approximation result is stored in calibration circuitry 20 as res(N−1). At decision diamond 320, it is determined if all MSB capacitors have been calibrated. If so, method 300 ends, and if not, a next capacitor is selected as the current capacitor to be calibrated and method 400 is repeated. Upon completion of method 400, a calibration value is stored for each MSB in calibration circuitry 20, res(L) to res(N−M).

In the embodiment described above, R1 is used to obtain each calibration value. In an alternate embodiment, calibration is performed alternating between using R1 and R2 as the redundant element that switch from Vrefh (sample phase) to Vrefl (approximation phase). In this case, the averaged result can be used, which may help reduce possible calibration errors from mismatch in the DAC element of R1. Note also, that in an alternate embodiment, the redundant bit(s) need not be used during the successive-approximation of process 314. In one embodiment, the value of one redundancy bit (i.e. redundancy element) should be large enough to overcome the largest possible MSB mismatch. This is achieved by using R1 and R2 during the successive-approximation, but alternatively, other types of redundancy techniques may be used. Note also that the method of using redundancy to obtain calibration values described in reference to FIG. 3 is not restricted to the MSBs sub-DAC, but can also extend to lower significant bits.

The calibration values described in reference to FIG. 3 can be stored in calibration circuitry 20 prior to operation of ADC 10. Then, during operation, each time a conversion result, RESULT, is obtained, calibration circuitry 20 can use these values to determine the CALIBRATED RESULT. In one embodiment, the calibration values are applied to the conversion results in the following manner: If the result of Bits(N−1:L)=0, no value is subtracted from the result, if the result of Bits(N−1:L)=1, subtract res(L) from the result, if the result of Bits(N−1:L)=2, subtract res(L)+res(1) from the result, if the result of Bits(N−1:L)=3, subtract 2*res(L)+res(1) from the result, if the result of Bits(N−1:L)=4, subtract 2*res(L)+res(1)+res(2) from the result, if the result of Bits(N−1:L)=5, subtract 3*res(L)+res(1)+res(2) from the result, if the result of Bits(N−1:L)=6, subtract 3*res(L)+res(1)+res(2)+res(3) from the result, . . . if the result of bits(N−1:L)=$2^M-2$, subtract $(2^M/2-1)$*res(L)+SUM(res(1) . . . res($2^M/2-1$)) from the result, and if the result of bits(N−1:L)=$2^M-1$, subtract $(2^M/2)$*res(L)+SUM(res(1) . . . res($2^M/2-1$)) from the result.

Note that the above application of the calibration values can be generalized as follows: If the conversion results of Bits(N−1:L)=R, then subtract the calibration adjustment value, calvalue(R), from the ADC result.

$$calvalue(R) = int\left(\frac{R+1}{2}\right) * res(L) + \sum_{x=1}^{int\left(\frac{R}{2}\right)} res(x)$$

In one embodiment, rather than storing each calibration value in calibration storage circuitry 20, res(L) and each of the summed values may be stored instead. This requires storing $2^M/2$ total values and the calibration can be applied in two steps (rather than performing the full summation after each result). That is, once the MSB bit conversions are complete, the value of these bits can be sent to calibration circuitry 20 and the calibration value can be computed over the next several clock cycles (while the LSBs are converting). In this manner, the CALIBRATED RESULT can be computed one clock cycle after determining the ADC RESULT.

In alternate embodiments, different combinations or summations of calibration values may be stored and the calculations performed in greater or fewer steps. Also, the calibration values or combination of calibration values can be stored in storage circuitry located outside of calibration circuitry 20.

By using the redundant elements during calibration, calibration can be performed without the need to add or re-size any of the SAR ADC components. For example, the size of any scaling capacitors can be kept ideal while still maintaining linearity of the ADC. Also, the method of using the redundant elements described herein for calibration does not affect the ADC's gain. Also, the ADC samples the full input charge and therefore does not experience signal-to-noise ratio (SNR) degradation. While the calibration described above may require a slightly longer calibration time than currently used systems, the calibration time does not affect the ADC sample rate because the calibration can be done prior to any conversions.

Although ADC 10 and the discussions herein have been described with respect to a single-ended ADC, the discussions herein also apply to differential ADCs. For example, for embodiments with a differential ADC, circuitry similar to that of FIGS. 1 and 2 may be used to provide the inputs for both the positive and negative inputs of differential comparator 16. For example, Vin may correspond to the negative-side of the differential ADC in which the array of DAC elements of DAC 12 receives Vin and provides Vout to the negative input of comparator 16, and a second array of DAC elements similar to the array of DAC elements of DAC 12 illustrated FIG. 2 would be used in place of REF DAC 14 to receive a second input voltage corresponding to the positive-side of the differential ADC and provide a second output voltage to the positive input of comparator 16. The methods of FIGS. 3 and 4 would be therefore be used for both the positive and negative sides of the differential ADC.

Therefore, by now it can be understood improved operation of a split-capacitor SAR ADC can be achieved through the use of redundancy in combination with a self-calibration method. With the calibration methods described above, a calibration value can be used after each conversion to quickly provide a calibrated result, while not compromising the normal operating speed of the ADC. Furthermore, with the use of the redundant elements to help handle the mismatch, the scaling capacitors need not be designed larger to ensure that the residual values are all positive values.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In one embodiment, the illustrated elements of system 10 are circuitry located on a single integrated circuit or within a same device. Alternatively, system 10 may include any number of separate integrated circuits or separate devices interconnected with each other. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, although a single-ended ADC is illustrated, the above calibration can also be applied to a differential ADC. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an analog-to-digital converter (ADC) includes a digital-to-analog converter (DAC) coupled to receive an analog input voltage, a high reference voltage, and a low reference voltage, and to provide an output voltage, in which the high reference voltage is greater than the low reference voltage. The DAC has a Most Significant Bits (MSBs) sub-DAC including a set of MSB DAC elements and a Least Significant Bits (LSBs) sub-DAC including a set of LSB DAC elements, a termination element coupled to the LSBs sub-DAC, a scaling capacitor coupled between the LSBs and MSBs sub-DACs, and one or more redundant DAC elements coupled in parallel with a DAC element of the DAC. The ADC also includes a comparator having a first input coupled to receive the output voltage of the DAC, a second input, and a comparison output based on a difference in voltage between the first input and the second input; successive-approximation-register (SAR) circuitry having an input coupled to receive the comparison output and an output to provide an uncalibrated digital value corresponding to an uncalibrated digital representation of the analog input voltage; and calibration circuitry coupled to receive the uncalibrated digital value and configured to apply one or more calibration values to the uncalibrated digital value to obtain a calibrated digital value corresponding to a calibrated digital representation of the input voltage. The calibration circuitry is configured to obtain a calibration value for each MSB DAC element using the set of LSB DAC elements, the termination element, and at least one of the one or more redundant DAC elements. In one aspect, each MSB DAC element, each LSB DAC element, the termination element, and each of the one or more redundant elements comprises a capacitor. In a further aspect, the calibration circuitry is configured to obtain a calibration value, for each MSB capacitor, by individually comparing a capacitance of the MSB capacitor to a sum of all capacitances of all lower significance bit capacitors of the MSBs sub-DAC, all capacitors of the LSBs sub-DAC, the termination element, and the one or more redundant elements. In a further aspect, the SAR circuitry is configured to perform a successive approximation to generate a corresponding capacitor mismatch approximation value for each individual comparison, and the calibration circuitry is configured to obtain the calibration value for each MSB capacitor by adjusting the corresponding capacitor mismatch approximation value by a value of the at least one or more redundant capacitors. In yet a further aspect, the DAC is characterized as an N-bit DAC, and the SAR circuitry is configured to perform the successive approximation to generate the corresponding capacitor mismatch approximation value for each individual comparison by using less than N bits of the DAC, wherein N is a positive integer value greater than 0. In another further aspect, the calibration circuitry is configured to store each calibration value. In another further aspect, the calibration circuitry is configured to store sums of selected calibration values. In another aspect, the calibration circuitry is configured to, for obtaining the calibration value for each MSB capacitor, during a sample phase: charge top plates of DAC capacitors coupled to the first input of the comparator to a common mode voltage; charge the MSB capacitor by coupling a bottom plate of the MSB capacitor to the low reference voltage; charge bottom plates of all DAC capacitors which are lower significance capacitors than the MSB capacitor to the high reference voltage; and charge capacitors of the at least one of the one or more redundant DAC capacitors by coupling bottom plates of the at least one of the one or more redundant DAC capacitors to the high reference voltage. In a further aspect, the calibration circuitry is further configured to, for obtaining the calibration value for each MSB capacitor, during a comparison phase following the sample phase: switch the bottom plate of the MSB capacitor to the high reference voltage and the bottom plates of all DAC capacitors which are lower significant capacitors than the MSB capacitor to the low reference voltage; and switch the bottom plates of the at least one of the one or more redundant DAC capacitors to the low reference voltage. In yet a further aspect, the calibration circuitry is further configured to, for obtaining the calibration value for each MSB capacitor, provide DAC control signals to the DAC to control coupling a bottom plate of each capacitor of the DAC to one of the high reference voltage and the low reference voltage during each sample phase and comparison phase. In another further aspect, the SAR circuitry is configured to, for obtaining the calibration for each MSB capacitor, during the comparison phase, perform a successive-approximation using less than all of the DAC elements of the DAC to determine an approximation result. In yet a further aspect, the calibration circuitry is further configured to, for obtaining the calibration value for each MSB capacitor, during the comparison phase, adjust the approximation result based on a weight of the at least one of the one or more redundant DAC elements, wherein the adjusted approximation results correspond to the calibration values for the MSB capacitors. In another aspect of the above embodiment, the one or more redundant elements includes a first redundant element having half the capacitance of the DAC element. In a further aspect, the one or more redundant elements include a second redundant element having half the capacitance of the DAC element, wherein the SAR circuitry is configured to use both the first and second redundant elements, in addition to the MSB DAC elements and the LSB DAC elements, to provide the uncalibrated digital value corresponding to the uncalibrated digital representation of the analog input voltage. In yet an even further aspect, the calibration circuitry is configured to use at least one of the first and second redundant elements during calibration of the MSB DAC elements. In yet an even further aspect, the calibration circuitry is configured to alternate the use of the first and second redundant elements during calibration of the MSB DAC elements.

In an another embodiment, in a successive approximation analog-to-digital converter (SARADC) including a digital-to-analog converter (DAC) and a comparator coupled to a DAC output, wherein the DAC includes DAC capacitors, a termination capacitor, and one or more redundant DAC capacitors, a method includes determining a calibration value for a selected DAC capacitor of the DAC. During a sample phase, the method includes charging top plates of DAC capacitors at a first input of the comparator to a common mode voltage; applying a low reference voltage to a bottom plate of the selected DAC capacitor; applying a high reference voltage to bottom plates of the one or more redundant DAC capacitors and to bottom plates of all DAC capacitors which are lower significance capacitors than the selected DAC capacitor, wherein the higher reference voltage is greater than the low reference voltage; and disconnecting the top plates of the DAC capacitors from the common mode voltage at the end of the sample phase. During an approximation phase, the method includes applying the high reference volage to the bottom plate of the selected DAC capacitor; applying the low reference voltage to the bottom plates of the at least one of the one or more redundant DAC capacitors and to the bottom plates of all DAC capacitors which are lower significant capacitors than the selected DAC capacitor; and running a successive approximation on an output of the comparator using at least a subset of the DAC elements to obtain an approximation result. In one aspect of the another embodiment, the approximation phase further includes adjusting the approximation result based on a weight of the one or more redundant DAC capacitors, wherein the adjusted approximation results correspond to the calibration value for the selected DAC capacitor. In a further aspect, each DAC capacitor of a plurality of DAC capacitors of the DAC is selected in turn as the selected DAC capacitor, wherein the method further includes repeating the sample phase and the approximation phase for each selected DAC capacitor to obtain calibrations values for the DAC capacitors of the plurality of DAC capacitors. In another further aspect, the DAC is further characterized as a split-capacitor DAC, and the plurality of DAC capacitors correspond to the Most Significant Bits (MSBs) of the DAC.

What is claimed is:

1. An analog-to-digital converter (ADC) comprising:
   a digital-to-analog converter (DAC) having a Most Significant Bits (MSBs) sub-DAC including a set of MSB DAC elements and a Least Significant Bits (LSBs) sub-DAC including a set of LSB DAC elements, a termination element coupled to the LSBs sub-DAC, a scaling capacitor coupled between the LSBs and MSBs sub-DACs, and one or more redundant DAC elements coupled in parallel with a DAC element of the DAC, the DAC coupled to receive an analog input voltage, a high reference voltage, and a low reference voltage, and to provide an output voltage, wherein the high reference voltage is greater than the low reference voltage;
   a comparator having a first input coupled to receive the output voltage of the DAC, a second input, and a comparison output based on a difference in voltage between the first input and the second input;
   successive-approximation-register (SAR) circuitry having an input coupled to receive the comparison output, and an output to provide an uncalibrated digital value corresponding to an uncalibrated digital representation of the analog input voltage; and
   calibration circuitry coupled to receive the uncalibrated digital value and configured to apply one or more calibration values to the uncalibrated digital value to obtain a calibrated digital value corresponding to a calibrated digital representation of the input voltage, wherein the calibration circuitry is configured to obtain a calibration value for each MSB DAC element using the set of LSB DAC elements, the termination element, and at least one of the one or more redundant DAC elements,
   wherein each MSB DAC element, each LSB DAC element, the termination element, and each of the one or more redundant elements comprises a capacitor, and the calibration circuitry is further configured to obtain a calibration value, for each MSB capacitor, by individually comparing a capacitance of the MSB capacitor to a sum of all capacitances of all lower significance bit capacitors of the MSBs sub-DAC, all capacitors of the LSBs sub-DAC, the termination element, and the one or more redundant elements.

2. The ADC of claim 1, wherein the SAR circuitry is configured to perform a successive approximation to generate a corresponding capacitor mismatch approximation value for each individual comparison, and the calibration circuitry is configured to obtain the calibration value for each MSB capacitor by adjusting the corresponding capacitor mismatch approximation value by a value of the at least one or more redundant capacitors.

3. The ADC of claim 2, wherein the DAC is characterized as an N-bit DAC, and the SAR circuitry is configured to perform the successive approximation to generate the corresponding capacitor mismatch approximation value for each individual comparison by using less than N bits of the DAC, wherein N is a positive integer value greater than 0.

4. The ADC of claim 2, wherein the calibration circuitry is configured to store each calibration value.

5. The ADC of claim 2, wherein the calibration circuitry is configured to store sums of selected calibration values.

6. The ADC of claim 1, wherein the calibration circuitry is configured to, for obtaining the calibration value for each MSB capacitor, during a sample phase:
   charge top plates of DAC capacitors coupled to the first input of the comparator to a common mode voltage;
   charge the MSB capacitor by coupling a bottom plate of the MSB capacitor to the low reference voltage;
   charge bottom plates of all DAC capacitors which are lower significance capacitors than the MSB capacitor to the high reference voltage; and charge capacitors of each capacitor of the at least one of the one or more redundant DAC capacitors by coupling bottom plates of the at least one of the one or more redundant DAC capacitors to the high reference voltage.

7. The ADC of claim 6, wherein the calibration circuitry is further configured to, for obtaining the calibration value for each MSB capacitor, during a comparison phase following the sample phase:
switch the bottom plate of the MSB capacitor to the high reference voltage and the bottom plates of all DAC capacitors which are lower significant capacitors than the MSB capacitor to the low reference voltage; and
switch the bottom plates of each capacitor of the at least one of the one or more redundant DAC capacitors to the low reference voltage.

8. The ADC of claim 7, wherein the calibration circuitry is further configured to, for obtaining the calibration value for each MSB capacitor, provide DAC control signals to the DAC to control coupling a bottom plate of each capacitor of the DAC to one of the high reference voltage and the low reference voltage during each sample phase and comparison phase.

9. The ADC of claim 7, wherein the SAR circuitry is configured to, for obtaining the calibration for each MSB capacitor, during the comparison phase, perform a successive-approximation using less than all of the DAC elements of the DAC to determine an approximation result.

10. The ADC of claim 9, wherein the calibration circuitry is further configured to, for obtaining the calibration value for each MSB capacitor, during the comparison phase, adjust the approximation result based on a weight of the at least one of the one or more redundant DAC elements, wherein the adjusted approximation results correspond to the calibration values for the MSB capacitors.

11. The ADC of claim 1, wherein the one or more redundant elements comprises a first redundant element having half the capacitance of the DAC element.

12. The ADC of claim 11, wherein the one or more redundant elements comprise a second redundant element having half the capacitance of the DAC element, wherein the SAR circuitry is configured to use both the first and second redundant elements, in addition to the MSB DAC elements and the LSB DAC elements, to provide the uncalibrated digital value corresponding to the uncalibrated digital representation of the analog input voltage.

13. The ADC of claim of claim 12, wherein the calibration circuitry is configured to use at least one of the first and second redundant elements during calibration of the MSB DAC elements.

14. The ADC of claim 13, wherein the calibration circuitry is configured to alternate the use of the first and second redundant elements during calibration of the MSB DAC elements.

15. In a successive approximation analog-to-digital converter (SARADC) including a digital-to-analog converter (DAC) and a comparator coupled to a DAC output, wherein the DAC includes DAC capacitors, a termination capacitor, and one or more redundant DAC capacitors, a method comprising:
determining a calibration value for a selected DAC capacitor of the DAC,
wherein during a sample phase, the method comprises:
charging top plates of DAC capacitors at a first input of the comparator to a common mode voltage;
applying a low reference voltage to a bottom plate of the selected DAC capacitor;
applying a high reference voltage to bottom plates of each capacitor of the one or more redundant DAC capacitors and to bottom plates of all DAC capacitors which are lower significance capacitors than the selected DAC capacitor, wherein the higher reference voltage is greater than the low reference voltage; and
disconnecting the top plates of the DAC capacitors from the common mode voltage at the end of the sample phase; and
wherein during an approximation phase, the method comprises:
applying the high reference volage to the bottom plate of the selected DAC capacitor;
applying the low reference voltage to the bottom plates of each capacitor of the at least one of the one or more redundant DAC capacitors and to the bottom plates of all DAC capacitors which are lower significant capacitors than the selected DAC capacitor; and
running a successive approximation on an output of the comparator using at least a subset of the DAC elements to obtain an approximation result.

16. The method of claim 15, wherein the approximation phase further comprises:
adjusting the approximation result based on a weight of the one or more redundant DAC capacitors, wherein the adjusted approximation results correspond to the calibration value for the selected DAC capacitor.

17. The method of claim 16, wherein each DAC capacitor of a plurality of DAC capacitors of the DAC is selected in turn as the selected DAC capacitor, wherein the method further comprises repeating the sample phase and the approximation phase for each selected DAC capacitor to obtain calibrations values for the DAC capacitors of the plurality of DAC capacitors.

18. The method of claim 17, wherein the DAC is further characterized as a split-capacitor DAC, and the plurality of DAC capacitors correspond to the Most Significant Bits (MSBs) of the DAC.

19. An analog-to-digital converter (ADC) comprising:
a digital-to-analog converter (DAC) having a Most Significant Bits (MSBs) sub-DAC including a set of MSB DAC elements and a Least Significant Bits (LSBs) sub-DAC including a set of LSB DAC elements, a termination element coupled to the LSBs sub-DAC, a scaling capacitor coupled between the LSBs and MSBs sub-DACs, and one or more redundant DAC elements coupled in parallel with a DAC element of the DAC, the DAC coupled to receive an analog input voltage, a high reference voltage, and a low reference voltage, and to provide an output voltage, wherein the high reference voltage is greater than the low reference voltage;
a comparator having a first input coupled to receive the output voltage of the DAC, a second input, and a comparison output based on a difference in voltage between the first input and the second input;
successive-approximation-register (SAR) circuitry having an input coupled to receive the comparison output, and an output to provide an uncalibrated digital value corresponding to an uncalibrated digital representation of the analog input voltage; and
calibration circuitry coupled to receive the uncalibrated digital value and configured to apply one or more calibration values to the uncalibrated digital value to obtain a calibrated digital value corresponding to a calibrated digital representation of the input voltage, wherein the calibration circuitry is configured to obtain a calibration value for each MSB DAC element using the set of LSB DAC elements, the termination element, and at least one of the one or more redundant DAC elements, wherein each MSB DAC element, each LSB DAC element, the termination element, and each of the one or more redundant elements comprises a capacitor, and wherein the calibration circuitry is further configured to, for obtaining the calibration value for each MSB capacitor, during a sample phase:

charge top plates of DAC capacitors coupled to the first input of the comparator to a common mode voltage;

charge the MSB capacitor by coupling a bottom plate of the MSB capacitor to the low reference voltage;

charge bottom plates of all DAC capacitors which are lower significance capacitors than the MSB capacitor to the high reference voltage; and charge capacitors of the at least one of the one or more redundant DAC capacitors by coupling bottom plates of each capacitor of the at least one of the one or more redundant DAC capacitors to the high reference voltage.

20. The ADC of claim 19, wherein the calibration circuitry is further configured to, for obtaining the calibration value for each MSB capacitor, during a comparison phase following the sample phase:

switch the bottom plate of the MSB capacitor to the high reference voltage and the bottom plates of all DAC capacitors which are lower significant capacitors than the MSB capacitor to the low reference voltage; and switch the bottom plates of each capacitor of the at least one of the one or more redundant DAC capacitors to the low reference voltage.

* * * * *